(12) United States Patent
Lee et al.

(10) Patent No.: US 9,576,707 B2
(45) Date of Patent: Feb. 21, 2017

(54) CONDUCTIVE THIN FILM AND TRANSPARENT ELECTRODE INCLUDING GRAPHENE OXIDE AND CARBON NANOTUBE, AND METHODS OF PRODUCING THE SAME

(71) Applicant: RESEARCH & BUSINESS FOUNDATION SUNGKYUNKWAN UNIVERSITY, Suwon-si (KR)

(72) Inventors: Hyoyoung Lee, Suwon-si (KR); Eun Hee Hwang, Seoul (KR); Hye Mi Lee, Seongnam-si (KR); Jung Hyun Lee, Gunpo-si (KR); Eun Kyo Lee, Suwon-si (KR); Gi Youn Kim, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 567 days.

(21) Appl. No.: 13/951,993

(22) Filed: Jul. 26, 2013

(65) Prior Publication Data

US 2013/0306915 A1    Nov. 21, 2013

Related U.S. Application Data

(63) Continuation of application No. PCT/KR2012/000617, filed on Jan. 26, 2012.

(30) Foreign Application Priority Data

Jan. 26, 2011    (KR) .................. 10-2011-0007965

(51) Int. Cl.
*H01B 1/06* (2006.01)
*H01B 13/00* (2006.01)
(Continued)

(52) U.S. Cl.
CPC ........... *H01B 13/0036* (2013.01); *C03C 17/22* (2013.01); *H01B 1/04* (2013.01);
(Continued)

(58) Field of Classification Search
CPC ............................... B82Y 10/00; B82Y 30/00
(Continued)

(56) References Cited

U.S. PATENT DOCUMENTS

| 9,090,805 B2* | 7/2015 | Lee | ......................... B01D 69/08 |
| 2009/0146111 A1* | 6/2009 | Shin | ........................ B82Y 30/00 |
| | | | 252/510 |

(Continued)

FOREIGN PATENT DOCUMENTS

| KR | 10-2008-0001333 A | 1/2008 |
| WO | WO 2009/085015 A1 | 7/2009 |

OTHER PUBLICATIONS

Moon et al., "Reduced graphene oxide by chemical graphitization," Nat. Commun., 1:73 (2010).*

(Continued)

*Primary Examiner* — Khanh Tuan Nguyen
(74) *Attorney, Agent, or Firm* — NSIP Law

(57) ABSTRACT

A conductive thin film, a transparent electrode, and methods of producing the same are provided. A method for preparing a conductive thin film may involve forming a layer of reduced graphene oxide and carbon nanotube on a substrate using a reducing agent containing a halogen atom.

19 Claims, 1 Drawing Sheet

(51) Int. Cl.
  *C03C 17/22* (2006.01)
  *H01L 31/0224* (2006.01)
  *H01B 1/04* (2006.01)
  *H01L 51/44* (2006.01)
(52) U.S. Cl.
  CPC .. *H01L 31/022466* (2013.01); *C03C 2217/28* (2013.01); *H01L 51/442* (2013.01)
(58) Field of Classification Search
  USPC ........................................ 252/510; 429/231.8
  See application file for complete search history.

(56) References Cited

U.S. PATENT DOCUMENTS

| | | | |
|---|---|---|---|
| 2010/0105834 A1 | 4/2010 | Tour et al. | |
| 2010/0218979 A1* | 9/2010 | Chang | B82Y 10/00 174/250 |
| 2010/0273060 A1* | 10/2010 | Yang | B82Y 10/00 429/231.8 |
| 2013/0130037 A1* | 5/2013 | Bol | H01L 51/105 428/408 |
| 2013/0133925 A1* | 5/2013 | Kim | H01B 13/34 174/126.4 |

OTHER PUBLICATIONS

International Search Report dated Jul. 31, 2012 issued in counterpart international patent application No. PCT/KR2012/000617. (2 pages in English).

\* cited by examiner

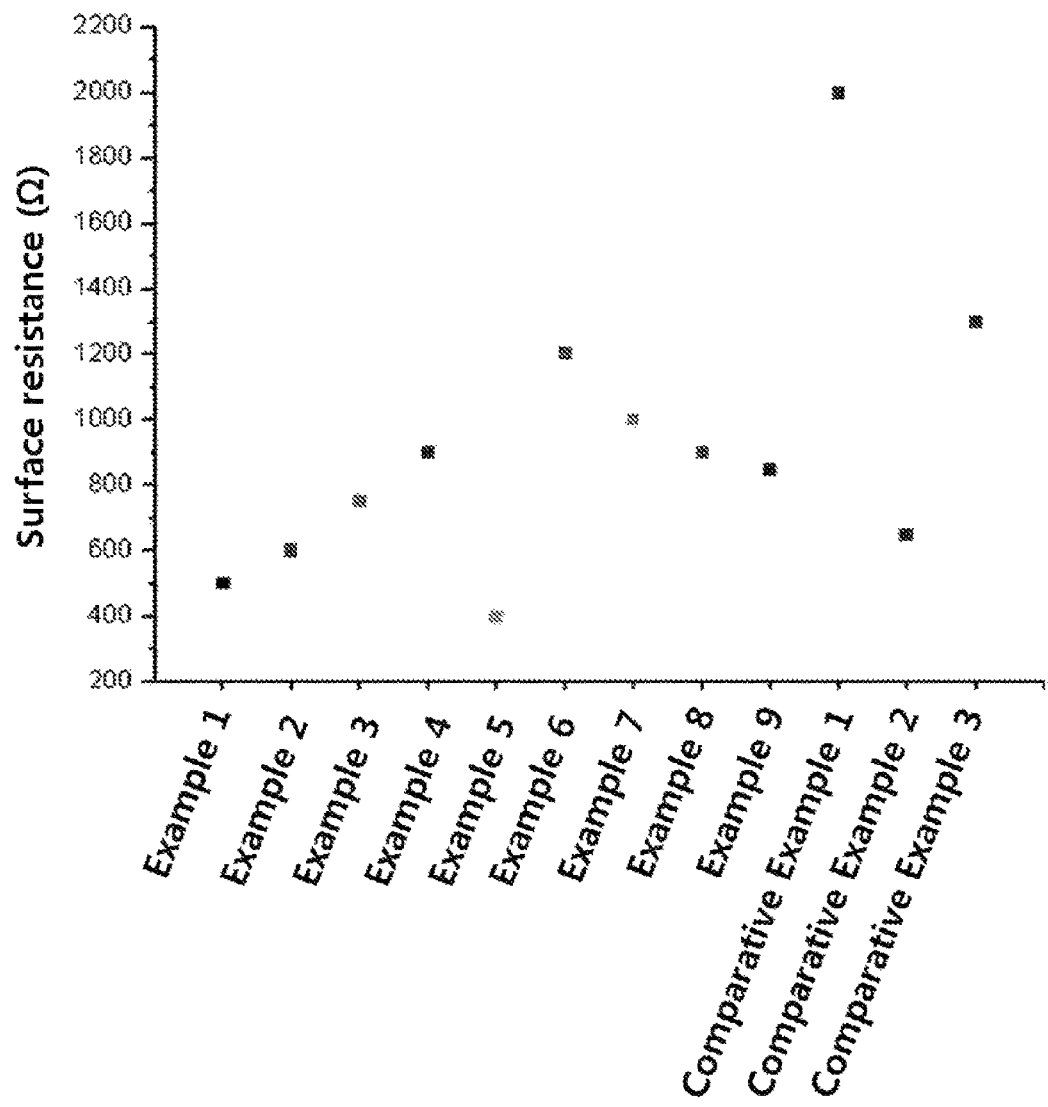

CONDUCTIVE THIN FILM AND TRANSPARENT ELECTRODE INCLUDING GRAPHENE OXIDE AND CARBON NANOTUBE, AND METHODS OF PRODUCING THE SAME

CROSS-REFERENCE TO RELATED APPLICATIONS

This application is a continuation of International Application No. PCT/KR2012/000617 filed on Jan. 26, 2012, in the Korean Intellectual Property Office, which claims the benefit of Korean Patent Application No. 10-2011-0007965 filed on Jan. 26, 2011, the entire disclosure of both of which are incorporated herein by reference for all purposes.

BACKGROUND

1. Field

The following description relates to a transparent electrode including graphene oxide and carbon nanotube, a conductive thin film including a transparent electrode, and a method of preparing such a transparent electrode or such a conductive thin film. The description also relates to, for example, a method of preparing a conductive thin film made of a reduced graphene oxide and a carbon nanotube, and a transparent electrode including a conductive thin film prepared by the same method. The following description further relates to a method of preparing a conductive thin film made of a reduced graphene oxide and a carbon nanotube, which enables the use of a low temperature process and mass production and can improve both electrical conductivity and transparency, and a transparent electrode including the conductive thin film prepared by the same method.

2. Description of Related Art

A transparent electrode is being widely used in various electronic devices, which require both a light transmission characteristic and electrical conductivity. Examples of such electronic devices include image sensors, solar cells, liquid crystal display devices, organic EL displays and touch screen panels. The transparent electrode consists of a transparent substrate and a conductive film formed on the transparent substrate. For the conductive film, an indium thin oxide (ITO), which facilitates formation of a thin film and has an excellent light transmission characteristic and electrical conductivity, has been mostly used. However, using ITO is undesirable in certain cases because ITO requires high preparation costs, and because ITO exhibits low flexibility which may increase surface resistance and deteriorate the durability of the finished product, for example, as when ITO is used in a flexible display.

Accordingly, attempts to apply low dimensional materials, which have high electrical conductivity while being flexible, such as a carbon nanotube and graphene, to the transparent electrode have recently increased. However, if a conductive thin film made of only the carbon nanotube is used for a transparent electrode under the same conditions, the electrical conductivity is low, compared to the excellent transparency, due to impurities caused from the preparation process or the raw material itself. If a conductive thin film made of only graphene is used for a transparent electrode, the electrical conductivity is relatively fine, compared to the carbon nanotube, but the transmittance is low. In order to resolve the problems, there has been an attempt to improve the electrical conductivity by using a combined material of carbon nanotubes and graphenes to effectively connect empty spaces between the carbon nanotubes and the graphenes through a line contact between the carbon nanotubes and a surface contact between the graphenes. However, in the technology for bulk synthesis of graphenes that has been known to the present, the mass production has been difficult due to restriction to use of a reducing agent, low efficiency, impurities included, and other causes. Especially, in case of reducing a graphene oxide by using known reducing agents such as hydrazine hydrate, sodium borohydrate ($NaBH_4$) and sulfuric acid ($H_2SO_4$), a reaction at a high temperature is required. Thus, there has been the problem that the conductive film cannot be applied to a flexible substrate.

SUMMARY

In one general aspect, there is provided a method for preparing a conductive thin film, the method involving: forming a layer of reduced graphene oxide and carbon nanotube on a substrate using a reducing agent containing a halogen atom.

The layer of reduced graphene oxide and carbon nanotube may be formed by: (S1) coating the substrate with a liquid in which a graphene oxide and a carbon nanotube of which a surface is modified by carboxylic acid, a graphene oxide and a carbon nanotube, or a reduced graphene oxide and a carbon nanotube are dispersed; and (S2) exposing the substrate to a vapor of a solution including the reducing agent.

The layer of reduced graphene oxide and carbon nanotube may be formed by: (S1) coating the substrate with a liquid in which a graphene oxide is dispersed; (S2) exposing the substrate to a vapor of a solution including the reducing agent; (S3) coating the substrate obtained in S2 with a liquid in which a carbon nanotube with a surface modified by carboxylic acid is dispersed; and (S4) exposing the substrate obtained in S3 to a vapor of a solution including the reducing agent.

The layer of reduced graphene oxide and carbon nanotube may be formed by: (S1) coating the substrate with a liquid in which a graphene oxide is dispersed; (S2) exposing the substrate to a vapor of a solution including the reducing agent; and (S3) coating the substrate obtained in S2 with a dispersion liquid in which a carbon nanotube is dispersed in a solvent.

The layer of reduced graphene oxide and carbon nanotube may be formed by: (S1) coating a substrate with a liquid in which a graphene oxide is dispersed; (S2) coating the substrate with a liquid in which a carbon nanotube with a surface modified by carboxylic acid is dispersed; and (S3) exposing the substrate obtained in S2 to a vapor of a solution including the reducing agent.

The layer of reduced graphene oxide and carbon nanotube may be formed by: (S1) coating the substrate with a liquid in which a carbon nanotube with a surface modified by carboxylic acid is dispersed; (S2) coating the substrate with a liquid in which a graphene oxide is dispersed; and (S3) exposing the substrate obtained in S2 to a vapor of a solution including the reducing agent.

The substrate may include glass, Si/$SiO_2$ or polyethylene terephthalate.

The layer of reduced graphene oxide and carbon nanotube may be formed by: coating the substrate with a liquid comprising graphene oxide or carbon nanotube, the coating involving a spin coating method, a dip coating method, a bar coater method or a spray coating method.

The layer of reduced graphene oxide and carbon nanotube may be formed by: coating the substrate with a liquid comprising graphene oxide or carbon nanotube, the coating involving a spin coating method with the rotation speed of the spin coating ranging from 400 rpm to 6000 rpm.

The reducing agent containing the halogen atom may be selected from the group consisting of HI, HCl and HBr.

The graphene oxide on the substrate may be reduced using a vapor of a solution that includes the reducing agent containing the halogen atom to form the layer of reduced graphene oxide and carbon nanotube, and the solution may be a mixture of HI solution and a weak acid selected from the group consisting of acetic acid, trifluoroacetic acid, carbonic acid, formic acid and benzoic acid.

The general aspect of the method may further involve: centrifuging and sonifying the liquid before coating the substrate.

The general aspect of the method may further involve: performing heat treatment of the substrate exposed to the vapor under $H_2$ atmosphere.

The heat treatment of the substrate may be performed under the $H_2$ atmosphere at a temperature of 80° C. or greater and 150° C. or less, and the substrate may be a polyethylene terephthalate.

The heat treatment of the substrate may be performed under the $H_2$ atmosphere at a temperature of 100° C. or greater to 1500° C. or less, and the substrate may be a glass or a $Si/SiO_2$.

The general aspect of the method may further involve: doping the substrate and the layer of graphene oxide and carbon nanotube with $HNO_3$, $H_2SO_4$, or $SOCl_2$ by exposing the substrate and the layer to a vapor of $HNO_3$, $H_2SO_4$ or $SOCl_2$.

A surfactant may be used to disperse the carbon nanotube in a solvent, and the solvent may be coated on the substrate to form the layer of reduced graphene oxide and nanocarbon tube.

The surfactant may be one selected from the group consisting of sodium dodecyl sulfate (SDS), sodium octylbenzene sulfonate (NaOBS), sodium dodecylbenzene sulfate (SDBS), TRITON X-100, sodium dodecyl sulfonate (SDSA), sodium butylbenzoate (NaBBS), dodecyl trimethyl ammonium bromide (DTAB), cetyl trimethyl ammonium bromide (CTAB), dextrin, polystyrene-polyethylene oxide (PS-PEO) and a combination thereof.

In another general aspect, there is provided a transparent electrode comprising a conductive thin film made of a reduced graphene oxide and a carbon nanotube, wherein the reduced graphene oxide is prepared by exposing a graphene oxide to a vapor of a solution including a reducing agent containing a halogen atom.

The carbon nanotube may be a reduced carbon nanotube prepared by exposing a carbon nanotube to a vapor of a solution including a reducing agent containing a halogen atom to be reduced.

The transparent electrode may be a flexible electrode.

BRIEF DESCRIPTION OF THE DRAWINGS

FIG. 1 is a graph illustrating measurement results of surface resistance of conductive thin films prepared in accordance with various examples according to the present disclosure and in accordance with comparative examples.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

The inventors of the present disclosure have researched a method for preparing a conductive thin film, which can be used in transparent electrodes, for example, in the field of flexible devices. During that time, the inventors learned that a conductive thin film made of a reduced graphene oxide and a carbon nanotube improves both the electrical conductivity and the transmittance, and that when the conductive thin film is prepared by using a reducing agent containing a halogen atom, a low temperature process and mass production are possible. As a result, the inventors have completed the thin films, devices and methods described in the present disclosure.

The present disclosure describes a method for preparing a conductive thin film, which enables a low temperature process and mass production and improves both electrical conductivity and transmittance.

The present disclosure also describes a transparent electrode adopting the conductive thin film.

The present disclosure further provides:

A method for preparing a conductive thin film made of a reduced graphene oxide and a carbon nanotube, comprising: (S1) coating a substrate with a dispersion liquid in which a graphene oxide and a carbon nanotube of which a surface is modified by carboxylic acid; a graphene oxide and a carbon nanotube; or a reduced graphene oxide and a carbon nanotube are dispersed in a solvent; and (S2) exposing the substrate to a vapor of a solution including a reducing agent containing a halogen atom to prepare a conductive thin film.

A method for preparing a conductive thin film made of a reduced graphene oxide and a carbon nanotube, comprising:

(S1) coating a substrate with a dispersion liquid in which a graphene oxide is dispersed in a solvent; (S2) exposing the substrate to a vapor of a solution including a reducing agent containing a halogen atom; (S3) coating the substrate obtained in S2 with a dispersion liquid in which a carbon nanotube of which a surface is modified by carboxylic acid is dispersed in a solvent; and (S4) exposing the substrate obtained in S3 to a vapor of a solution including a reducing agent containing a halogen atom to prepare a conductive thin film.

A method for preparing a conductive thin film made of a reduced graphene oxide and a carbon nanotube, comprising:

(S1) coating a substrate with a dispersion liquid in which a graphene oxide is dispersed in a solvent; (S2) exposing the substrate to a vapor of a solution including a reducing agent containing a halogen atom; and (S3) coating the substrate obtained in S2 with a dispersion liquid in which a carbon nanotube is dispersed in a solvent to prepare a conductive thin film.

A method for preparing a conductive thin film made of a reduced graphene oxide and a carbon nanotube, comprising:

(S1) coating a substrate with a dispersion liquid including a graphene oxide is dispersed in a solvent; (S2) coating the substrate with a dispersion liquid in which a carbon nanotube of which a surface is modified by carboxylic acid is dispersed in a solvent; and (S3) exposing the substrate obtained in S2 to a vapor of a solution in which a reducing agent containing a halogen atom to prepare a conductive thin film.

A method for preparing a conductive thin film made of a reduced graphene oxide and a carbon nanotube, comprising: (S1) coating a substrate with a dispersion liquid in which a carbon nanotube of which a surface is modified by carboxylic acid is dispersed in a solvent; (S2) coating the substrate with a dispersion liquid in which a graphene oxide is dispersed in a solvent; and (S3) exposing the substrate obtained in S2 to a vapor of a solution including a reducing agent containing a halogen atom to prepare a conductive thin film.

In accordance with the present disclosure, there is provided a method, wherein the substrate is glass, $Si/SiO_2$ or polyethylene terephthalate.

In accordance with the present disclosure, there is provided a method, wherein the substrate is coated by using a spin coating method, a dip coating method, a bar coater method or a spray coating method, and the substrate is, for instance, coated by using a spin coating method, and the rotation speed of the spin coating is from 400 rpm to 6000 rpm.

In accordance with the present disclosure, there is provided a method, wherein a surfactant is additionally used to disperse the carbon nanotube in the solvent, in case of a hydrophobic carbon nanotube is used, and the surfactant is one selected from the group consisting of sodium dodecyl sulfate (SDS), sodium octylbenzene sulfonate (NaOBS), sodium dodecylbenzene sulfate (SDBS), TRITON X-100, sodium dodecyl sulfonate (SDSA), sodium butylbenzoate (NaBBS), dodecyl trimethyl ammonium bromide (DTAB), cetyl trimethyl ammonium bromide (CTAB), dextrin, polystyrene-polyethylene oxide (PS-PEO) and mixtures thereof.

In accordance with the present disclosure, there is provided a method, wherein the reducing agent containing a halogen atom is selected from the group consisting of HI, HCl and HBr. The reducing agent may contain a halogen atom that is HI.

In accordance with the present disclosure, there is provided a method, wherein the solution including a reducing agent containing a halogen atom is a mixture of HI solution and a weak acid selected from the group consisting of acetic acid, trifluoroacetic acid, carbonic acid, formic acid and benzoic acid. For example, the solution including a reducing agent containing a halogen atom may be a mixture of HI solution and acetic acid or a mixture of HI solution and trifluoroacetic acid.

In accordance with the present disclosure, there is provided a method further including: centrifuging and sonifying the dispersion liquid before coating the substrate.

In accordance with the present disclosure, there is provided a method further including: performing heat treatment of the prepared conductive thin film under $H_2$ atmosphere, performing heat treatment of the substrate under $H_2$ atmosphere at a temperature of from 80° C. to 150° C. in case of the substrate is a polyethylene terephthalate, and performing heat treatment of the substrate under $H_2$ atmosphere at a temperature of from about 100° C. to about 1500° C. in case of the substrate is a glass or a $Si/SiO_2$.

In accordance with the present disclosure, there is provided a method further including: doping the prepared conductive thin film with $HNO_3$, $H_2SO_4$, or $SOCl_2$ by exposing the prepared conductive thin film to a vapor of $HNO_3$, $H_2SO_4$ or $SOCl_2$.

In accordance with the present disclosure, there is provided a transparent electrode comprising a conductive thin film made of a reduced graphene oxide and a carbon nanotube, wherein the carbon nanotube is a reduced carbon nanotube prepared by exposing a carbon nanotube to a vapor of a solution including a reducing agent containing a halogen atom to be reduced. For example, the carbon nanotube may be a reduced carbon nanotube prepared by exposing a carbon nanotube of which a surface is modified by carboxylic acid to a vapor of a solution including a reducing agent containing a halogen atom to be reduced. The transparent electrode in accordance with the present disclosure is flexible, and included in a display device or solar cell.

According to the preparation method of the present disclosure, by using a reducing agent containing a halogen atom or a mixture of a reducing agent containing a halogen atom and a weak acid as a reducing agent, it is possible to lower a temperature for preparation of a reduced graphene oxide to maximum minus 10° C. Accordingly, the preparation of a conductive thin film containing a reduced graphene oxide can be realized through a low temperature process in a simple manner, so that the possibility of mass production increases, and the prepared conductive thin film can be applied especially to a flexible substrate.

In addition, in the conductive thin film made of a combined material of a reduced graphene oxide and a carbon nanotube prepared according to the present disclosure, the fibrous carbon nanotube bridges graphene layers to one another so that an electrical network is effectively formed, and thus, a high electrical characteristic can be accomplished. Further, since the conductive thin film prepared according to the present disclosure retains both the advantage of the carbon nanotube in the high transmittance and the advantage of the graphene in the high electrical conductivity, both the electrical conductivity and the transmittance are improved.

The conductive thin film prepared according to the present disclosure can be used for a transparent electrode. Such a transparent electrode can be utilized in various display devices, solar cells, and so on.

Hereinafter, various illustrative examples of the present disclosure will be described in detail with reference to the accompanying drawings so that inventive concept may be readily implemented by those skilled in the art. However, it is to be noted that the present disclosure is not limited to the illustrative examples but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element.

Throughout the whole document, the term "on" that is used to designate a position of one element with respect to another element includes both a case that the one element is adjacent to the another element and a case that any other element exists between these two elements.

Throughout the whole document, the term "comprises or includes" and/or "comprising or including" used in the document means that one or more other components, steps, operations, and/or the existence or addition of elements are not excluded in addition to the described components, steps, operations and/or elements. Throughout the whole document, the terms "about or approximately" or "substantially"

are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for."

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Hereinafter, the present disclosure will be described in detail.

The method for preparing a conductive thin film made of a reduced graphene oxide and a carbon nanotube according to the present disclosure prepares a conductive thin film: (i) by coating a substrate with a dispersion liquid, in which a graphene oxide and a carbon nanotube of which a surface is modified by a carboxylic acid; a graphene oxide and a carbon nanotube; or a reduced graphene oxide and a carbon nanotube are dispersed in a solvent; and exposing the substrate to a vapor of a solution including a reducing agent containing a halogen atom; (ii) by coating a substrate with a dispersion liquid, in which a graphene oxide is dispersed in a solvent; exposing the substrate coated with the dispersion liquid to a vapor of a solution including a reducing agent containing a halogen atom to reduce the graphene oxide; coating a substrate with a dispersion liquid, in which a carbon nanotube of which a surface is modified by a carboxylic acid is dispersed in a solvent, to reduce the carbon nanotube as the same manner as described above; (iii) by coating a substrate with a dispersion liquid, in which a graphene oxide is dispersed in a solvent; reducing the graphene oxide in the same manner as described above; and coating the obtained substrate with a dispersion liquid, in which a carbon nanotube is dispersed in a solvent; (iv) by coating a substrate with each of a dispersion liquid, in which a graphene oxide is dispersed in a solvent, and a dispersion liquid, in which a carbon nanotube of which a surface is modified by carboxylic acid is dispersed in a solvent in order; and simultaneously reducing the graphene oxide and the carbon nanotube in the same manner as described above; or (v) coating a substrate with each of a dispersion liquid, in which a carbon nanotube of which a surface is modified by carboxylic acid is dispersed in a solvent, and a dispersion liquid, in which a graphene oxide is dispersed in a solvent in order; and simultaneously reducing the carbon nanotube and the graphene oxide in the same manner as described above.

The graphene oxide and reduced graphene oxide materials that are used in the present disclosure may be synthesized from a method known in the art, or a commercially available material may be used. For example, the graphene oxide may be synthesized from graphite by treating graphite with an acidic solution to obtain graphene oxide.

In order to obtain the carbon nanotube and the carbon nanotube having a surface modified by a carboxylic acid that are used in methods described in the present disclosure, materials that are synthesized from a method known in the art may be used, or a commercially available material may be used. For example, the carbon nanotube having a surface that is modified by a carboxylic acid can be synthesized by reacting a multi-wall or single-wall carbon nanotube with a mixture of a sulfuric acid and a nitric acid.

The solvent used in methods described in the present disclosure may be properly selected based on a hydrophilic or hydrophobic characteristic of a starting material. For example, water or an organic solvent, such as N-methylpyrrolidone (NMP), dimethylformamide (DMF), dimethylsulfoxide (DMSO), or N,N-dimethylacetamide, may be used.

A concentration of the dispersion liquid according to the present disclosure is closely associated with time for the preparation process of a thin film and transmittance of the prepared thin film. For example, the concentration of the dispersion liquid according to the present disclosure is in the range of 3 to 5 mg/mL, or approximately 3 mg/mL.

According to the present disclosure, a hydrophilic carbon nanotube having a surface modified by a carboxylic acid may be used, because the hydrophilic carbon nanotube is easily mixed with a hydrophilic graphene oxide.

When using a hydrophobic carbon nanotube at this stage, a solution may be used, in which the hydrophobic carbon nanotube is dispersed in a solvent by using a small amount of a surfactant, in order to easily disperse the hydrophobic carbon nanotube and the hydrophilic graphene oxide or the weak hydrophilic reduced graphene oxide. The surfactant according to the present disclosure is one selected from the group consisting of sodium dodecyl sulfate (SDS), sodium octylbenzene sulfonate (NaOBS), sodium dodecyl benzene sulfate (SDBS), TRITON X-100, sodium dodecyl sulfonate (SDSA), sodium butylbenzoate (NaBBS), dodecyl trimethyl ammonium bromide (DTAB), cetyltrimethylammonium bromide (CTAB), dextrin, a polystyrene-polyethylene oxide (PS-PEO) and mixtures thereof.

For the substrate used in the present disclosure, any substrate known in the art of the present disclosure may be used. For example, a glass, silicone or plastic substrate may be used. Especially, for a transparent flexible substrate, a polyethylene terephthalate (PET), polycarbonate (PC), polyimide (PI), polyethylene naphthalate (PEN) or a polystyrene (PS) substrate may be used. However, the present disclosure is not limited thereto. For example, a glass, $Si/SiO_2$ or polyethylene terephthalate may be used.

For the coating method at the present stage, a spin coating method, a dip coating method, a bar coater method or a spray coating method may be used. However, the present disclosure is not limited thereto. In an example, the spin coating method is used. The number of spins in the spin coating method is closely associated with a thickness of the thin film. As the number of spins increases, a thickness of the thin film becomes thin so that the transmittance increases. Accordingly, by adjusting the number of spins, it is possible to adjust the transmittance of the prepared conductive thin film. According to the preparation method of the present disclosure, the number of spins upon the spin coating is, for example, adjusted to a range of 400 to 6000 rpm. The transparency is superior within the above-described range. However, if the number of spins is beyond the range, the transparency is significantly deteriorated. In addition, the number of times for repetition of the spin coating is also closely associated with the thickness of the thin film. As the number of times of the spin coating increases, the thickness of the thin film increases so that the electrical conductivity is improved. In order to improve both the transmittance and the electrical conductivity in accordance with the present disclosure, in an example, the number of spins may be adjusted to the range of 400 to 6000 rpm so as to repeatedly perform the spin coating 1 to 5 times. In this example, the largest number of repetition for spin coatings does not exceed 1 to 5 times even when a substrate is coated with each of the graphene oxide, the reduced graphene oxide, the carbon nanotube and the carbon nanotube of which a surface is modified by a carboxylic acid, or a mixture of two of the materials.

At the reduction stage of the present disclosure, the conductive thin film is prepared by exposing a substrate to a vapor of a solution including a reducing agent containing a halogen atom. More specifically, the conductive thin film is completed by exposing a substrate to the vapor, and then, drying the substrate. Such drying is an usual stage for removing residues after the formation of the thin film and performed at a temperature of 50° C. to 90° C., or at approximately 80° C.

When the graphene oxide or the carbon nanotube of which a surface is modified by a carboxylic acid is exposed to a vapor of a solution including a reducing agent containing a halogen atom at the reduction stage, the graphene oxide is reduced by the reducing agent containing the halogen atom so that the reduced graphene oxide is prepared. A portion of the carboxylic acid of the carbon nanotube is also reduced. For instance, in the case where a substrate is coated with a solution in which the reduced graphene oxide and the carbon nanotube are dispersed therein, the electrical conductivity is further improved by the reduction process according to the present disclosure.

The reducing agent containing the halogen atom according to the present disclosure may be selected from the group consisting of HI, HCl and HBr. In an example, HI is used. For the solution including the reducing agent containing the halogen atom, a mixture of an HI solution and a weak acid selected from the group consisting of an acetic acid, a trifluoroacetic acid, a carbonic acid, a formic acid and a benzoic acid may be used. In this case, the weak acid performs at least two functions in reducing the graphene oxide. Firstly, a weak acid is added to strong acid HI so as to facilitate HI to be more effectively and easily dissociated into $I^-$ ions. Secondly, if the weak acid is added, rather than using HI solely, it is possible to prevent an over-reduction reaction, which proceeds to saturated hydrocarbon ($sp^3$) and may occur when the HI is used alone. Accordingly, if a mixture of a HI solution and a weak acid selected from the group consisting of an acetic acid, a trifluoroacetic acid, a carbonic acid, a formic acid and a benzoic acid is used as a reducing agent for the graphene oxide, a yield rate of the reduced graphene oxide can be improved.

If the graphene oxide is reduced by using the reducing agent, the temperature of the reaction can be lowered to maximum minus 10° C. Thus, according to the preparation method of the present disclosure, it is possible to prepare the reduced graphene oxide at a low minus temperature, in particular, minus 10° C. The conductive thin film including the reduced graphene oxide can also be produced at a low temperature in a large scale and can be applied to a flexible substrate.

In accordance with another illustrative example of the present disclosure, the preparation method of the present disclosure may further include centrifuging and sonifying the dispersion liquid before coating the substrate. The centrifuging process separates the graphene oxide or the reduced graphene oxide and the carbon nanotube lump. The sonifying treatment also effectively separates the carbon nanotube lump and the graphene oxide or the reduced graphene oxide. As a result, an effect in improving surface roughness of the prepared thin film is achieved.

In accordance with another illustrative example of the present disclosure, the preparation method of the present disclosure may further include performing heat treatment of the prepared conductive thin film under $H_2$ atmosphere. This treatment effectively removes water, a functional group containing oxygen, residues or the like remaining on a surface of the thin film after doping. Furthermore, the treatment additionally reduces components in the inside of the thin film through the $H_2$ atmosphere and densifies the thin film, so as to more improve the electrical conductivity and the transmittance of the conductive thin film. A range for a temperature of the heat treatment stage is decided depending on components of the substrate. In case of a polyethyleneterephthalate substrate, the heat treatment may be performed at 80° C. to 150° C. under the $H_2$ atmosphere. In case of a glass or $Si/SiO_2$ substrate, the heat treatment may be added at 100° C. to 1500° C. If the temperature of the heat treatment is below the temperature ranges described above, the aforementioned effect cannot be achieved. If the temperature of the heat treatment exceeds the temperature ranges described above, the substrate will be damaged to be dented or broken such that it will be changed in shape.

In accordance with another illustrative example of the present disclosure, the prepared conductive thin film may be further doped with materials such as $HNO_3$, $H_2SO_4$, or $SOCl_2$. More specifically, the doping is performed by exposing the conductive thin film coated on the substrate of the present disclosure to $HNO_3$, $H_2SO_4$ or $SOCl_2$ at a room temperature for 30 minutes. The additional doping stage slightly reduces the transmittance while significantly reducing the surface resistance. Thus, there is an effect in significantly improving the electrical conductivity of the thin film by the small sacrifice of the transmittance. Whether or not to perform the additional doping can be properly selected by one of ordinary skill in the art of the present disclosure. In the aspect of the improvement of the electrical conductivity, it is desirable to perform the doping, and thereafter, finally perform the heat treatment.

The conductive thin film of the present disclosure, obtained as described above, improves the transmittance and the electrical conductivity, while maintaining the characteristics of the graphene and the carbon nanotube. Accordingly, the conductive thin film can be used as a transparent electrode. Especially, since the conductive thin film can be prepared through the simple process, it provides high economic feasibility, and furthermore, has high conductivity and excellent uniformity. In addition, since the conductive thin film can be prepared to have a large area, and the thickness of the thin film can be adjusted by controlling the number of spins upon coating the thin film on the substrate, it is easy to adjust the transmittance. For instance, because the conductive thin film is flexible, the conductive thin film may be handled with ease and can be used in a field that requires a bendable transparent electrode.

With respect to the field in which the transparent electrode including the above-described thin film may be applied, the transparent electrode can be useful for application in various display devices, such as a liquid crystal display device, an electrode paper display device, an organic light emitting display device. Further, the transparent electrode may be used in the field of cells, such as a solar cell. In the event that a transparent electrode including a conductive thin film according to various examples of the present disclosure is used in such a device, the transparent electrode may be formed to have a thickness of 20 to 100 nm in consideration of transparency of the electrode. If the thickness of the transparent electrode exceeds 100 nm, the transparency of the electrode may decline and light efficiency may deteriorate. If the thickness of the transparent electrode is below 20 nm, the surface resistance may become overly low or the thin film may be ununiformed. In the aspect of the light efficiency and the surface resistance, the transparent electrode may be formed to have a thickness of 20 to 80 nm.

As described above, if the transparent electrode is applied to the display devices, the display devices can be freely bent thereby increasing convenience. Likewise, if a transparent electrode according to the present disclosure is applied to a solar cell, the solar cell can have various bending structures depending on a direction of movement of light so that light can be effectively used. As a result, improving the light efficiency becomes possible. Since methods for applying the transparent electrode to various display devices and solar cells are known in the art of the present disclosure, detailed description of the methods is omitted herein.

Hereinafter, the configuration of the present disclosure will be explained in a greater detail with reference to various examples. However, the scope of the present disclosure is not limited to the examples.

EXAMPLE 1

Preparation of a Conductive Thin Film Using HI as a Reducing Agent 54 mg of a graphene oxide (Bay Carbon Inc. SP-1, which was obtained by oxidizing graphite) and 6 mg of a carbon nanotube (TOPNANOSYS) of which a surface is modified by a carboxylic acid were dispersed in 20 mL of distilled water. The dispersion liquid was sonified by the POWER SONIC 420 ultrasonic generator for one day while setting the intensity of the ultrasonic waves to be high. Thereafter, the dispersion liquid was centrifuged to obtain a supernatant liquid so that a homogenized dispersion liquid was obtained. The obtained dispersion liquid was spin-coated on a polyethyleneterephthalate substrate through 3 stages (15 seconds at 400 rpm; 30 seconds at 6000 rpm; and 60 seconds at 3000 rpm). After the prepared thin film was dried in vacuum for 2 hours, the spin coating of the dispersion liquid was repeated 3 times so that a thin film having a thickness of 60 nm was formed. After the thin film was exposed to a vapor of 0.7 mL of a HI solution (Aldrich) at a room temperature for at least one day, the thin film was dried at 80° C. to remove residues.

EXAMPLE 2

Preparation of a Conductive Thin Film Using HI as a Reducing Agent

The same process as that in Example 1 was conducted, except that 42 mg of a graphene oxide and 18 mg of a carbon nanotube of which a surface was modified by a carboxylic acid were used.

EXAMPLE 3

Preparation of a Conductive Thin Film Using HI as a Reducing Agent

The same process as that in Example 1 was conducted, except that 18 mg of a graphene oxide and 42 mg of a carbon nanotube of which a surface was modified by a carboxylic acid were used.

EXAMPLE 4

Preparation of a Conductive Thin Film Using HI as a Reducing Agent

The same process as that in Example 1 was conducted, except that 6 mg of a graphene oxide and 54 mg of a carbon nanotube of which a surface was modified by a carboxylic acid were used.

EXAMPLE 5

Preparation of a Conductive Thin Film Using a HI/Acetic Acid as a Reducing Agent The same process as that in Example 1 was conducted, except that 0.2 mL of a HI solution and 0.5 mL of an acetic acid (OCI Company Ltd.) were used, instead of 0.7 mL of the HI solution in Example 1.

EXAMPLE 6

Preparation of a Conductive Thin Film Using a HI/Acetic Acid as a Reducing Agent 60 mg of a graphene oxide (Bay Carbon Inc. SP-1, which was obtained by oxidizing graphite) was dispersed in mL of distilled water. The dispersion liquid was sonified by the POWER SONIC 420 ultrasonic generator for one day while setting the intensity of the ultrasonic waves to be high. Thereafter, the dispersion liquid was centrifuged to obtain a supernatant liquid so that a homogenized dispersion liquid was obtained. 60 mg of a carbon nanotube (TOPNANOSYS) of which a surface was modified by a carboxylic acid was dispersed in 20 mL of distilled water. The dispersion liquid was sonified by the POWER SONIC 420 ultrasonic generator for one day while setting the intensity of the ultrasonic waves to be high. Thereafter, the dispersion liquid was centrifuged to obtain a supernatant liquid so that a homogenized carbon nanotube dispersion liquid of which a surface is modified by a carboxylic acid was obtained. The graphene oxide dispersion liquid was spin-coated on a polyethyleneterephthalate substrate through 3 stages (15 seconds at 400 rpm; 30 seconds at 6000 rpm; and 60 seconds at 3000 rpm). After the prepared thin film was dried in vacuum for 2 hours, the spin coating of the dispersion liquid was repeated once. After the thin film was exposed to 0.2 mL of a HI solution (Aldrich) and 0.5 mL of an acetic acid (OCI Company Ltd) at a room temperature for at least one day, the thin film was dried at 80° C. to remove residues. The prepared thin film was coated with the carbon nanotube dispersion liquid of which a surface was modified by a carboxylic acid through 3 stages (15 seconds at 400 rpm; 30 seconds at 6000 rpm; and 60 seconds at 3000 rpm). After the generated thin film was dried in vacuum for hours, the spin coating of the dispersion liquid was repeated once. After the thin film was exposed to 0.2 mL of a HI solution (Aldrich) and 0.5 mL of an acetic acid (OCI Company Ltd) at a room temperature for at least one day, the thin film was dried at 80° C. to remove residues.

EXAMPLE 7

Preparation of a Conductive Thin Film Using an HI/Acetic Acid as a Reducing Agent The same process as that in Example 6 was conducted, except that a carbon nanotube was used, instead of the carbon nanotube of which a surface was modified by a carboxylic acid as used in Example 6.

EXAMPLE 8

Preparation of a Conductive Thin Film Using an HI/Acetic Acid as a Reducing Agent 60 mg of a graphene oxide (Bay Carbon Inc. SP-1, which was obtained by oxidizing graphite) was dispersed in mL of distilled water. The dispersion liquid was sonified by the POWER SONIC 420 ultrasonic generator for one day while setting the intensity of the ultrasonic waves to be high. Thereafter, the dispersion liquid was centrifuged to obtain a supernatant liquid so that a homogenized graphene oxide dispersion liquid was obtained. In addition, 60 mg of a carbon nanotube (TOPNANOSYS) of which a surface was modified by a carboxylic acid was dispersed in 20 mL of distilled water. The dispersion liquid was sonified by the POWER SONIC 420 ultrasonic generator for one day while setting the intensity of the ultrasonic waves to be high. Thereafter, the dispersion liquid was centrifuged to obtain a supernatant liquid so that a homogenized carbon nanotube dispersion liquid of which a surface was modified by a carboxylic acid was obtained. The graphene oxide dispersion liquid was spin-coated on a polyethyleneterephthalate substrate through 3 stages (15 seconds at 400 rpm; 30 seconds at 6000 rpm; and 60 seconds at 3000 rpm). After the prepared thin film was dried in vacuum for 2 hours, the spin coating of the dispersion liquid was repeated once. The prepared thin film was spin-coated with the carbon nanotube of which a surface was modified by a carboxylic acid through 3 stages (15 seconds at 400 rpm; 30 seconds at 6000 rpm; and 60 seconds at 3000 rpm). After the generated thin film was dried in vacuum for 2 hours, the spin coating of the dispersion liquid was repeated once. After the thin film was exposed to 0.2 mL of a HI solution (Aldrich) and 0.5 mL of an acetic acid (OCI Company Ltd) at a room temperature for at least one day, the thin film was dried at 80° C. to remove residues.

EXAMPLE 9

Preparation of a Conductive Thin Film Using a HI/Acetic Acid Mixture as a Reducing Agent The same process as that in Example 8 was conducted, except that the substrate is coated first with the carbon nanotube of which a surface was modified by a carboxylic acid, and then, with the graphene oxide dispersion liquid.

COMPARATIVE EXAMPLE 1

Preparation of a Conductive Thin Film Using a Hydrazine Hydrate as a Reducing Agent The same process as that in Example 5 was conducted, except that the reaction was conducted at 80° C. by using 0.7 mL (Aldrich) of a hydrazine solution, instead of the HI solution and the acetic acid of Example 5.

COMPARATIVE EXAMPLE 2

The same process as that in Example 5 was conducted, except that the carbon nanotube of which a surface was modified by a carboxylic acid was not used.

COMPARATIVE EXAMPLE 3

The same process as that in Example 5 was conducted, except that the graphene oxide was not used.

EXPERIMENTAL EXAMPLE

Measurement of Surface Resistance and Transmittance

Surface resistance and transmittance of the thin films prepared in the examples and the comparative examples were measured. Table 1 below provides the results of the measurement.

TABLE 1

| Examples | Reducing Agent | Reduction Reaction Temperature | Surface Resistance (Ω) | Transmission (%) |
| --- | --- | --- | --- | --- |
| Example 1 | HI | Room temperature | 500 | 85 |
| Example 2 | HI | Room temperature | 600 | 85 |
| Example 3 | HI | Room temperature | 750 | 87 |
| Example 4 | HI | Room temperature | 900 | 87 |
| Example 5 | HI/acetic acid | Room temperature | 400 | 85 |
| Example 6 | HI/acetic acid | Room temperature | 1200 | 83 |
| Example 7 | HI/acetic acid | Room temperature | 1000 | 84 |
| Example 8 | HI/acetic acid | Room temperature | 900 | 82 |
| Example 9 | HI/acetic acid | Room temperature | 850 | 83 |
| Comparative Example 1 | Hydrazine hydrate | 80° C. | 2000 | 80 |
| Comparative Example 2 | HI/acetic acid | Room temperature | 650 | 76 |
| Comparative Example 3 | HI/acetic acid | Room temperature | 1300 | 89 |

As shown in Table 1 above, upon comparison of Examples 1 to 5 with Comparative Example 1, the present disclosure can prepare a reduced graphene oxide at a room temperature by using HI or a HI/acetic acid as a reducing agent. It was identified that while similar transmittance was maintained, the electrical conductivity was improved with the much low value for the surface resistance. It is believed that the improvement resulted from the high ratio of the reduction into the reduced graphene owing to the significantly superior reduction power of the HI or the HI/acetic acid to the graphene oxide, compared to the reduction power of the hydrazine. In addition, upon comparing Examples 1 to 5 with Comparative Examples 2 and 3, the value for the surface resistance of the thin film made of the reduced graphene oxide and the carbon nanotube is lower than that of the thin film made of only the carbon nanotube, so that the electrical conductivity was improved. Further, the transmittance was improved, compared to the thin film made of only the reduced graphene oxide.

In addition, Examples 6 to 9 show that the electrical conductivity and the transparency can be improved even when the substrate is coated with each of the reduced graphene oxide, the carbon nanotube, and the carbon nanotube of which a surface is modified by a carboxylic acid or a mixture of two of the materials. The preparation method of the present disclosure can achieve a unique bridge effect, i.e., when each of the materials used is coated, two layers of nano thickness are loosely stacked so that the materials are mixed with each other, and fibrous carbon nanotubes bridge the graphene layers.

Meanwhile, FIG. 1 shows measurement results for transmittance of the thin films prepared in Examples 1 to 4 by varying the composition of the graphene oxide and the carbon nanotube. From the results of FIG. 1, it is identified that as the amount of the carbon nanotube increased, the transmittance increased. One of ordinary skill in the art of the present disclosure can properly vary the composition of the graphene oxide and the carbon nanotube, in consideration of the relationship with the electrical conductivity.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for preparing a conductive thin film, the method comprising:
   forming a layer comprising reduced graphene oxide and carbon nanotube having a surface modified by carboxylic acid on a substrate using a reducing agent containing a halogen atom.

2. The method of claim 1, wherein the layer comprising reduced graphene oxide and carbon nanotube having a surface modified by carboxylic acid is formed by:
   (S1) coating the substrate with a liquid having one of (a) a graphene oxide and carbon nanotube having a surface is modified by carboxylic acid, (b) a graphene oxide and a carbon nanotube, and (c) a reduced graphene oxide and a carbon nanotube, dispersed therein; and
   (S2) exposing the substrate obtained in S1 to a vapor of a solution comprising the reducing agent.

3. The method of claim 2, further including:
   centrifuging and sonifying the liquid before coating the substrate.

4. The method of claim 2, further including:
   performing heat treatment of the substrate exposed to the vapor under $H_2$ atmosphere.

5. The method of claim 4, wherein the heat treatment of the substrate is performed under the $H_2$ atmosphere at a temperature of 80° C. or greater and 150° C. or less, and the substrate is a polyethylene terephthalate.

6. The method of claim 4, wherein the heat treatment of the substrate is performed under the $H_2$ atmosphere at a temperature of 100° C. or greater to 1500° C. or less, and the substrate is a glass or a $Si/SiO_2$.

7. The method of claim 2, wherein a surfactant is used to disperse a carbon nanotube in a solvent and the solvent is coated on the substrate to form the layer comprising reduced graphene oxide and carbon nanotube having a surface modified by carboxylic acid.

8. The method of claim 7, wherein the surfactant is one selected from the group consisting of sodium dodecyl sulfate (SDS), sodium octylbenzene sulfonate (NaOBS), sodium dodecylbenzene sulfate (SDBS), TRITON X-100, sodium dodecyl sulfonate (SDSA), sodium butylbenzoate (NaBBS), dodecyl trimethyl ammonium bromide (DTAB), cetyl trimethyl ammonium bromide (CTAB), dextrin, polystyrene-polyethylene oxide (PS-PEO) and a combination thereof.

9. The method of claim 1, wherein the layer comprising reduced graphene oxide and carbon nanotube having a surface modified by carboxylic acid is formed by:
   (S1) coating the substrate with a liquid in which a graphene oxide is dispersed;
   (S2) exposing the substrate obtained in S1 to a vapor of a solution comprising the reducing agent;
   (S3) coating the substrate obtained in S2 with a liquid in which carbon nanotube having a surface modified by carboxylic acid is dispersed; and
   (S4) exposing the substrate obtained in S3 to a vapor of a solution comprising the reducing agent.

10. The method of claim 1, wherein the layer comprising reduced graphene oxide and carbon nanotube having a surface modified by carboxylic acid is formed by:
    (S1) coating the substrate with a liquid in which a graphene oxide is dispersed;
    (S2) exposing the substrate obtained in S1 to a vapor of a solution comprising the reducing agent; and
    (S3) coating the substrate obtained in S2 with a dispersion liquid in which a carbon nanotube is dispersed in a solvent.

11. The method of claim 1, wherein the layer comprising reduced graphene oxide and carbon nanotube having a surface modified by carboxylic acid is formed by:
    (S1) coating a substrate with a liquid in which a graphene oxide is dispersed;
    (S2) coating the substrate obtained in S1 with a liquid in which carbon nanotube having a surface modified by carboxylic acid is dispersed; and
    (S3) exposing the substrate obtained in S2 to a vapor of a solution comprising the reducing agent.

12. The method of claim 1, wherein the layer comprising reduced graphene oxide and carbon nanotube having a surface modified by carboxylic acid is formed by:
    (S1) coating the substrate with a liquid in which carbon nanotube having a surface modified by carboxylic acid is dispersed;
    (S2) coating the substrate obtained in S1 with a liquid in which a graphene oxide is dispersed; and
    (S3) exposing the substrate obtained in S2 to a vapor of a solution comprising the reducing agent.

13. The method of claim 1, wherein the substrate comprises one of glass, $Si/SiO_2$ and polyethylene terephthalate.

14. The method of claim 1, wherein the layer comprising reduced graphene oxide and carbon nanotube having a surface modified by carboxylic acid is formed by:
    coating the substrate with a liquid comprising graphene oxide or carbon nanotube,
    wherein coating is performed using one of a spin coating method, a dip coating method, a bar coater method and a spray coating method.

15. The method of claim 1, wherein the layer comprising reduced graphene oxide and carbon nanotube having a surface modified by carboxylic acid is formed by:
    coating the substrate with a liquid comprising graphene oxide or carbon nanotube, the coating involving a spin coating method with the rotation speed of the spin coating ranging from 400 rpm to 6000 rpm.

16. The method for claim 1, wherein the reducing agent containing the halogen atom is selected from the group consisting of HI, HCl and HBr.

17. The method of claim 1, further comprising:
    doping the substrate and the layer comprising graphene oxide and carbon nanotube having a surface modified by carboxylic acid with a dopant selected from the group consisting of $HNO_3$, $H_2SO_4$, and $SOCl_2$ by exposing the substrate and the layer to a vapor of the respective dopant.

18. A method for preparing a conductive thin film, the method comprising:
    forming a layer comprising reduced graphene oxide and carbon nanotube on a substrate using a reducing agent containing a halogen atom,
    wherein graphene oxide on the substrate is reduced using a vapor of a solution that comprises the reducing agent containing the halogen atom, and
    wherein the solution comprises a mixture of HI solution and a weak acid.

19. The method of claim 18, wherein the weak acid is selected from the group consisting of acetic acid, trifluoroacetic acid, carbonic acid, formic acid and benzoic acid.

* * * * *